United States Patent [19]

Simko

[11] Patent Number: 4,486,769
[45] Date of Patent: Dec. 4, 1984

[54] DENSE NONVOLATILE ELECTRICALLY-ALTERABLE MEMORY DEVICE WITH SUBSTRATE COUPLING ELECTRODE

[75] Inventor: Richard T. Simko, Los Altos, Calif.

[73] Assignee: XICOR, Inc., Milpitas, Calif.

[21] Appl. No.: 230,683

[22] Filed: Feb. 2, 1981

Related U.S. Application Data

[63] Continuation-in-part of Ser. No. 6,030, Jan. 24, 1979, Pat. No. 4,274,012, said Ser. No. 6,026.

[51] Int. Cl.³ .................. H01L 27/02; H01L 29/78; H01L 29/04; G11C 11/40
[52] U.S. Cl. .................................. 357/41; 357/23; 357/59; 365/185
[58] Field of Search .................. 357/23 VT, 41, 59; 365/185

[56] References Cited

U.S. PATENT DOCUMENTS

| | | |
|---|---|---|
| 4,099,196 | 7/1978 | Simko . |
| 4,119,995 | 10/1978 | Simko . |
| 4,274,012 | 6/1981 | Simko ........................ 357/23 VT |
| 4,300,212 | 11/1981 | Simko ........................ 357/23 VT |
| 4,314,265 | 2/1982 | Simko ........................ 357/41 |

OTHER PUBLICATIONS

W. S. Johnson et al., "A 16 Kb Electrically Erasable Nonvolatile Memory," Digest 1980, International Solid State Circuits Conference, pp. 152-153.
D. J. DiMaria et al., "Electrically-Alterable Memory Using a Dual Electron Injector Structure," IEEE Electron Device Letters, vol. EDL-1, No. 9, Sep. 1980.

*Primary Examiner*—Gene M. Munson
*Attorney, Agent, or Firm*—Fitch, Even, Tabin & Flannery

[57] ABSTRACT

A compact, floating gate, nonvolatile, electrically-alterable memory device fabricated with three layers of polysilicon and a substrate coupling electrode is described. A particular form of the device utilizes asperities to promote tunnel current flow through relatively thick oxides by means of relatively low average applied voltages. The use of four electrode layers leads to an extremely dense cell and memory array configuration. The substrate electrode is used to establish bias voltages in the cell.

7 Claims, 5 Drawing Figures

DENSE NONVOLATILE ELECTRICALLY-ALTERABLE MEMORY DEVICE WITH SUBSTRATE COUPLING ELECTRODE

This application is a continuation-in-part of copending applications Ser. No. 6030, now U.S. Pat. No. 4,274,012, "Substrate Coupled Floating Gate Memory Cell" filed Jan. 24, 1979 and Ser. No. 6026, now U.S. Pat. No. 4,300,212 entitled "Dense Nonvolatile Electrically Alterable Memory Devices" filed Jan. 24, 1979, which are incorporated herein by reference.

The present invention is generally directed to nonvolatile semiconductor memory devices and methods, and more particularly is directed to nonvolatile MOS floating gate memory systems utilizing four layers of gates and electrodes in a compact cell arrangement wherein one electrode is formed in the substrate.

In data processing systems, memory devices and methods for the storage of information are of critical importance. A long-standing practical problem associated with semiconductor technology is that most conventional semiconductor memory elements are volatile, i.e., when power is removed, the content of the memory is lost. Many structures have been proposed or demonstrated for providing nonvolatility together with electrical alterability to semiconductor memory circuits. However, practical difficulties such as limitations on the number of useful erase/write cycles which may be effected during the lifetime of the device, retention time of data by the memory device and operational restrictions limiting ease of use or the ability to carry out electrical modification of the stored data, have tended to restrict the utility of such nonvolatile semiconductor devices having a floating gate structure. In this regard, devices based on a MOS (metal-oxide-semiconductor) floating gate structure are conventionally employed in nonvolatile electrically-alterable memory structures. Such devices use a floating gate island of conducting material, which is electrically insulated from the substrate, but capacitively coupled to the substrate to form the gate of an MOS transistor adapted to sense the state of charge of the floating gate. Depending on the presence or absence of charge on the floating gate, this MOS transistor may be placed in a conducting ("on") state or nonconducting ("off") state for storage of binary "1"s or "0"s. Various means of introducing and removing the signal charge from a floating gate have been used in such memory devices. Charge can be introduced onto the floating gate using hot electron injection and/or so-called "tunneling" mechanisms. The term "tunneling" is used herein in a broad sense to include the emission of an electron from the surface of a conductor into an adjacent insulator through the energy barrier. Once charge is introduced to a dielectrically isolated floating gate, it remains (effectively) permanently trapped on the gate because the floating gate is completely surrounded by an insulating material, which acts as a barrier to the discharging of the floating gate. However, charge can be removed from the floating gate by exposure to radiation (UV light, x-rays), avalanche injection, or by tunneling effects.

Various device structures are conventionally utilized to convey charge to and from the floating gate and a substrate [Frohmann-Bentchkowsky, "A Fully-Decoded 2048-Bit Electrically Programmable MOS-ROM", Digest 1971, IEEE International Solid State Circuits Conference, pp. 80–81; U.S. Pat. No. 3,660,819, U.S. Pat. No. 3,996,657]. However, high currents must be drawn during writing of electrons to the floating gate ("programming") of such devices because only a small fraction of the programming current is sufficiently displaced and energetic to reach the floating gate through the relatively thick oxide (e.g., 1000 Angstroms). Another technique is to use a very thin oxide of precisely predetermined thickness, in the range of from approximately 50 to 200 Angstroms, to separate the floating gate from a programming terminal in the substrate [E. Harari, "A 256-Bit Nonvolatile Static RAM", Digest 1978, IEEE International Solid State Circuits Conference, pp. 109–109; U.S. Pat. No. 3,500,142 and W. S. Johnson et al, "A 16 Kb Electrically Erasable Nonvolatile Memory", Digest 1980, International Solid State Circuits Conference, pp. 152–153]. Charge is "tunneled" to and from a floating gate element with bidirectional symmetry though a relatively thin (50–200 Angstroms) oxide, the direction depending upon the electric field vector. Because of the bidirectionally symmetrical character of the tunnel oxide, the nonvolatile cell may be subject of possible disturb problems which cause the memory to lose its contents. In particular, examples of disturb problems include limitations in the number of read cycles and cell memory content being affected by adjacent cell operations. Moreover, it is difficult to reliably manufacture such very thin oxide layers of precisely controlled thickness and electrical properties in large-scale production.

Enhanced tunneling between multiple layers of polysilicon may form the basis for additional nonvolatile elements, and various semiconductor devices using such enhanced tunneling have been proposed [DiMaria and Kerr, "Interface Effects and High Conductivity in Oxides Grown from Polycrystalline Silicon", Applied Physics Letters, pp. 505–507, November, 1975; Andersen and Kerr, "Evidence for Surface Asperity Mechanism of Conductivity in Oxides Grown in Polycrystalline Silicon", J. Applied Physics, pp. 4834–4836, Vol. 48, No. 11, November, 1977; U.S. Pat. No. 4,099,196; Berenga, et. at., "E$^2$PROM TV Synthesizer", 1978 IEEE International Solid State Circuits Conference, pp. 196–197]. Such enhanced tunneling permits relatively thick oxides to separate tunneling elements, using relatively conventional programming voltages. However, such conventional nonvolatile semiconductor memory devices still have various disadvantages and limitations, and improved floating gate semiconductor devices would be desirable. In this connection, conventional floating gate memory devices may use relatively high voltages and currents for charging and discharging the floating gate, and such voltages and currents present isolation and design difficulties and limitations with respect to integrated circuit elements associated with the memory device, and may provide disturbance problems for adjacent memory cells in an array of such cells. Further, at the present time, the manufacturing yield of integrated circuits is an approximately negative exponential function of actual device layout area. Therefore, for the same integrated circuit minimum line width design rules, a significant increase in yield may be provided by reducing nonvolatile memory cell area, and such higher yield is related directly to lower manufacturing cost.

Accordingly, it is an object of the present invention to provide an improved, dense electrically-alterable, nonvolatile semiconductor memory element or cell.

A further object of the present invention is to provide a dense electrically-alterable nonvolatile semiconductor memory element composed of four layers of electrodes, with one layer formed in the semiconductor substrate, thereby enabling the need for only three polysilicon layers to form the rest of the memory element according to the present invention.

Another object of the present invention is to greatly enhance overlap areas between a floating gate conductor and its associated programming, word select/erase and bias electrodes, thereby significantly increasing the number of nonvolatile memory cycles available, while retaining dense cell geometries.

Yet another object of the invention is to provide an electrically-alterable, nonvolatile memory device comprising an integrated circuit array of a plurality of such dense elements which are readily accessible without disturbance to the other elements in the array.

These and other objects of the invention will become apparent in connection with the following detailed description and the accompanying drawings of which:

Figure 1:
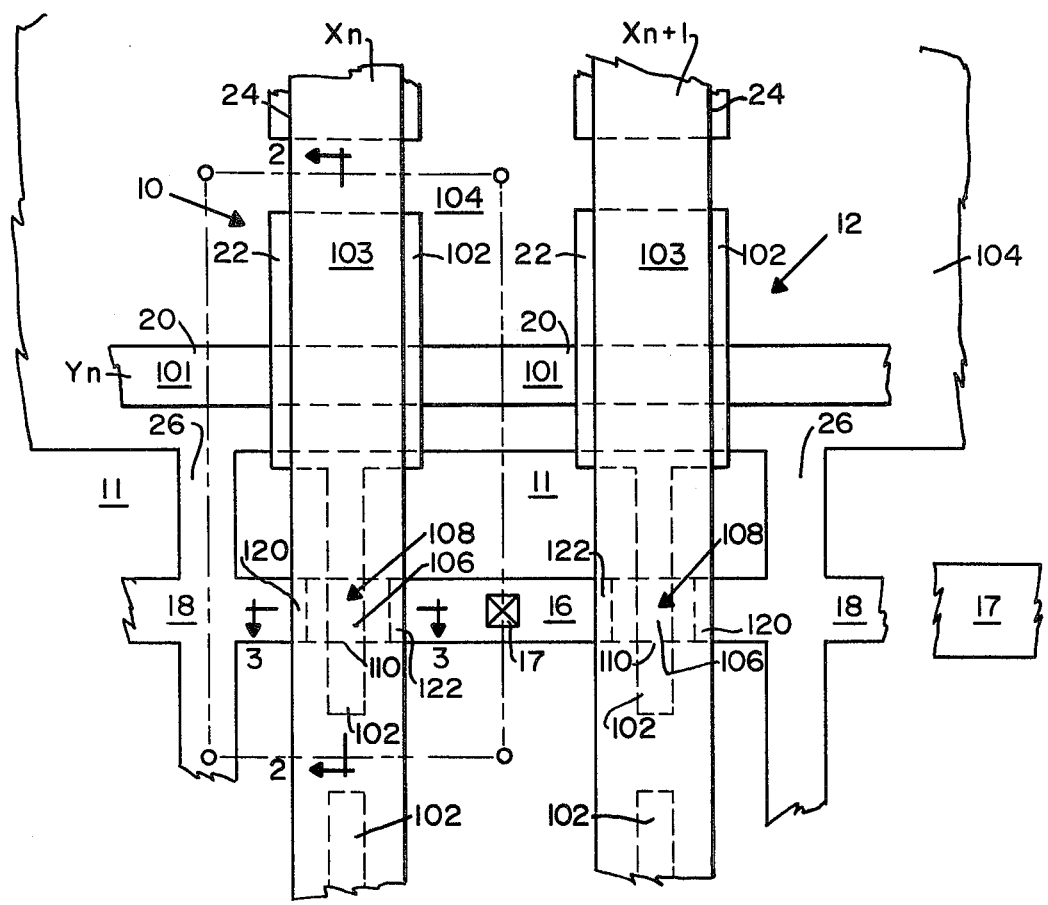
FIG. 1 is a plan view of an embodiment of an array of nonvolatile, electrically-alterable floating gate cells in accordance with the present invention.

Generally, the present invention is directed to compact, nonvolatile, electrically-alterable semiconductor memory elements of the floating gate type which may be constructed from three layers of conductive material, such as polycrystalline silicon, deposited on a semiconductor substrate. The invention is also directed to methods for charging and discharging the floating gate of such devices.

Devices in accordance with the invention comprise a substantially monocrystalline semiconductor substrate, an electrically isolated floating gate conductor overlying the substrate, means for introducing electrons onto the floating gate to provide the floating gate with a negative potential, and means for removing electrons from the floating gate to provide said floating gate with a potential more positive than said negative potential. The devices further comprise a bias electrode formed in said substrate, of a conductivity type opposite that of said substrate, and capacitatively coupled to the floating gate, and means for detecting the potential state of said floating gate.

The various elements of the devices forming the means for introducing electrons onto the floating gate and the means for removing electrons from the floating gate, together with the floating gate itself, may be formed from a three layer polysilicon structure and an underlying monocrystalline semiconductor substrate.

As indicated, the devices comprise a substantially monocrystallline semiconductor substrate of one conductivity type, and in this connection p-type monocrystalline silicon wafers are the preferred substrate, although n-type silicon substrate wafers, epitaxial monocrystalline n- or p-type layers on a monocrystalline dielectric substrate such as sapphire or other semiconductive materials are contemplated for different embodiments of the invention.

As also indicated, the present devices comprise at least one floating gate, electrically-isolated conductor overlying the substrate. A portion of the floating gate forms the gate of an MOS sensing transistor in the semiconductor substrate so that the charge state of the floating gate may be sensed for reading of the charge state memory contents of the device. The floating gate conductor may be a conducting polysilicon gate surrounded completely by an insulating material, such as thermally-grown silicon dioxide. The floating gate may be separated from the substrate in the region of the MOS sensing transistor by conventionally (e.g., thermally) grown silicon dioxide dielectric layers of readily manufacturable thickness, such as in the range of from about 500 to 1500 Angstroms thick, and may be separated from the substrate by thicker oxide layers at other regions of the floating gate.

As will be described in more detail hereinafter, the means for removing charge from the floating gate may comprise a portion of the floating gate in capacitive relationship with an overlying word select/erase electrode. The upper surface of the floating gate disposed away from the semiconductor substrate and toward the erase electrode may be fabricated in such a manner to contain unidirectional means for enhancing electron tunneling across the insulating layer surrounding the floating gate. One option is to form asperities on the surface of the floating gate. Electron emission can occur from such a textured surface to the overlying erase electrode (which may also be fabricated of polycrystalline silicon), at relatively low applied voltages of less than about 40 volts. Such an enhanced electron transport may be due to enhanced Fowler-Nordheim tunnel emission and other mechanisms.

The means of injecting charge onto the floating gate may comprise a programming electrode similarly fabricated from polysilicon and underlying a portion of the floating gate. The programming electrode may similarly be provided with an upper surface having asperities or some other unidirectional means for enhancing electron tunneling across the insulation layer from the program control electrode to the floating gate. Electron emission from the programming electrode to the floating gate may consequently be similarly carried out at relatively low applied voltages of less than 40 volts potential difference between the program control electrode and the floating gate.

As also indicated, means for sensing the stored charge on the floating gate is provided, and in this connection a portion of the floating gate may form the gate of a sense transistor formed in the substrate. Depending on the electric charge level on the floating gate, the sense transistor may be rendered conducting (on) or nonconducting (off). For example, in an n-channel MOS sense transistor device, when sufficient electrons are present on the floating gate, the sense transistor is rendered nonconductive. On the other hand, when enough electrons are removed from the floating gate to cause its potential to be positive relative to the substrate underneath it, then the n-channel sense transistor is rendered conductive. The conductive or nonconductive state of the floating gate sense transistor forms a mechanism for detecting the presence or absence of charge on the floating gate and thus provides the basis for reading the information stored in the cell as a charge level on the floating gate.

An important element of the present devices is a bias electrode located in the substrate and positioned in part below the floating gate. The bias electrode is dielectrically insulated from the floating gate preferably by a layer of silicon dioxide. A primary function of the bias electrode is to properly bias by capacitive action the floating gate during the introduction of electrons onto the floating gate (write cycle). The bias electrode also functions to properly bias the floating gate by capacitive action during removal of electrons from the floating gate (erase cycle). The bias electrode may be formed in the substrate as a layer of opposite conductivity type from the rest of the substrate and positioned under portions of the programming electrode, the floating gate, and the word select/erase electrode.

If the bias electrode is brought sufficiently positive with respect to the programming electrode, which also underlies the floating gate, electrons will tunnel from the programming electrode to the floating gate. These electrons, in turn, alter the floating gate potential. As indicated, this relatively negative charge thus provided can be sensed by a suitable means such as a sensing transistor. Similarly the word select/erase electrode, which at least partially overlaps the floating gate and is insulated from the floating gate, may be brought to a predetermined high potential while the bias electrode is held at a predetermined low potential so that electrons will tunnel from the floating gate to the word select/erase electrode. In this manner, the floating gate may be provided with a relatively more positive voltage than the substrate underneath it, which can be sensed by a suitable means such as a sensing transistor whose source and drain electrodes are also preferably formed in the substrate.

The nonvolatile, electrically-alterable floating gate semiconductor memory elements may be fabricated in a four layer electrode and gate structure, with three of these layers formed from a material such as polysilicon. A portion of the first layer is overlapped by and is insulated from the second layer and each of the other two layers. A third layer overlaps a portion of the second layer and is insulated from the second layer and each of the other two layers. A fourth layer is formed in the substrate and is insulated from the second layer and all other layers. The second layer forms the floating gate to which and from which electrons can be transported or tunneled, by application of voltages applied to the other layers. The presence or absence of electrons can be detected by a remote portion of the floating gate which gates a sense transistor and thereby functions as a memory element. All of the polysilicon layers are insulated from the substrate material. The substrate is preferably a monocrystalline silicon substrate, but may also be of other semiconductive material. The fourth layer or substrate is isolated from the rest of the substrate by the reverse junction characteristics of the opposite type conductivity material which comprises this fourth layer region. The resulting structure is a dense nonvolatile electrically-alterable MOS element structure having favorable electrical characteristics.

Turning now to the drawings, the present invention will now be more particularly described with respect to the specific embodiment of a n-channel, nonvolatile electrically-erasable semiconductor device 10 illustrated in the drawings. Although the device 10 is a n-channel MOS device, it will be appreciated that other device technologies such as p-channel configurations may also be utilized and are contemplated herein.

Figure 2:
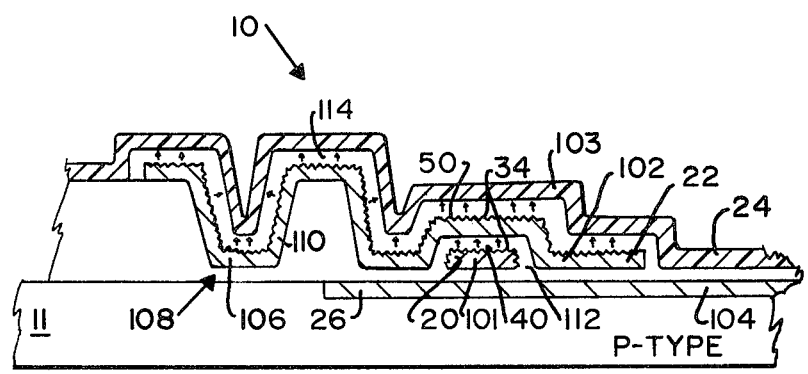
FIG. 2 is a cross sectional side view of one of the nonvolatile electrically-alterable memory cells of FIG. 1, taken through line 2—2.

FIG. 1 illustrates a plan view of one embodiment of an array of nonvolatile floating gate memory cells according to the present invention, including cells 10 and 12. Nonvolatile memory cell 10 is shown in FIG. 1 in the area defined by the dotted lines. As best seen in FIG. 2, a cell 10 preferably is constructed from a substantially monocrystalline p-type silicon semiconductor substrate 11, and three subsequently sequentially deposited, patterned, etched and insulated conductive layers 20, 22 and 24. A fourth layer 26 of opposite conductivity type from the substrate 11 is introduced into the substrate and isolated from the substrate by reverse junction action. A dielectric layer insulates layer 26 from the polysilicon layers. The polysilicon layers respectively form a programming electrode 101, and overlying floating gate 102, and a word select/erase electrode 103 overlying the floating gate. The fourth conductive layer is a bias electrode 104 formed in substrate 11 which underlies a portion of the word select/erase electrode, programming electrode and floating gate. A part 106 of the floating gate 102 forms the gate of an MOS sense transistor 108 formed in sense transistor channel 110 for sensing the electric potential charge state of the floating gate 102.

A mirror-image symmetrical cell 12 is shown in FIG. 1 associated with the cell 10. These cells 10, 12 form a cell pair which may be repeated to form a memory array extending in both the X (up-down) and Y (left-right) directions. In such an array, the word select/erase electrode 103 extends to contiguous cells to form the X ("row") word select lines of the array. Programming electrode 101 is repeated in the Y direction to contiguous cells to form the column programming lines of the array. The MOS sense transistors 108 of the two cells 10, 12 share a common drain 16 formed as an n-type diffusion or implant region in the p-substrate 11. Drain 16 is connected to an overlying metal line 17 for a Y-select sensing of the cell as part of a memory array. The same type of N-type diffusion or implant region 18 in the p-substrate 11 forms common source lines for transistors 108 in the Y direction. The area between each respective source 18 and drain 16 defines the channel region of the MOS sensing transistor. Although separate access to individual bits in a memory array is one option, in the embodiment shown in FIG. 1, the cells are organized in byte groups of, for example eight cells or "bits" each, with pairs of cells extending vertically being part of such a byte. As described in greater detail below, the substrate bias electrode 104 in such a byte array, as seen in FIG. 1, would also extend both vertically and horizontally to adjacent cells. On operation of a cell 10, the substrate may be biased to about 0 to −4 volts, the n-type channel may be biased to about 0 volts, and programming and erase voltages of plus 25 to 40 volts may be applied selectively to the polycrystalline and n-type substrate electrodes. X-Y decoding circuitry may be provided in accordance with conventional practice.

Figure 3:
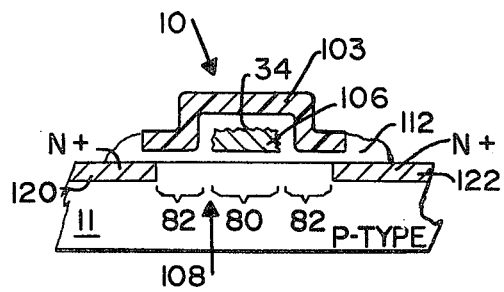
FIG. 3 is a cross sectional side view of one of the nonvolatile electrically-alterable cells of FIG. 1 taken through line 3—3.

The polycrystalline silicon layers 20, 22 and 24 may be deposited, patterned, etched, oxidized, and the substrate layer 26 diffused and implanted, in accordance with conventional practice. As best seen in FIG. 2, silicon dioxide dielectric layers 112, which in the illustrated embodiment are grown from the respective silicon substrate or polysilicon elements by conventional thermal oxidation techniques to an inter-element thickness of about 1000 Angstroms, dielectrically isolate the substrate and polysilicon layers from each other. The floating gate 102, programming electrode 101 and word select/erase electrode 103 are formed of polysilicon layer suitable sequentially deposited, and etched and oxidized, or otherwise patterned and fabricated by conventional photolithographic techniques, to form the illustrated device structure, which is shown in FIGS. 1-3. In FIG. 1 the various elements are shown as if the dielectric layers 112 were transparent, so that the underlying electrode structure may be illustrated. Further detail of the device structure is shown in the cross-sectional views of FIGS. 2 and 3.

As seen in FIG. 2, the polycrystalline silicon and substrate layers which form the electrodes, 101, 102, 103 and 104, include floating gate electron injecting means 40 and floating gate electron emission inducing means 50. Preferably, the means 40 for injecting electrons to the floating gate 102 comprises the formation of asperities on the surface of programming electrode 101, the first polysilicon layer 20, adjacent to the floating gate 102 polysilicon layer 22. To produce these surface asperities, this polysilicon layer 20 is treated by oxidation at approximately 1000 degrees C. In the present embodiment, floating gate 102 is preferably formed over layer 20 after layer 20 has been etched and oxidized to form the programming electrode 101, and an overlying layer of oxide 112 has been deposited. The means 50 for inducing electron emission from floating gate 102 also preferably includes the formation of asperities, in this case on the surface of floating gate 102 itself, to facilitate electron emission across an overlying silicon dioxide layer 114 to the word select/erase electrode 103. Asperities 34 are preferably formed on the upper surfaces of the floating gate 102 in the same manner as described above for the programming electrode 101.

Asperities to the extent they are understood, are small projections at the surface of a conductor which are present in numerous quantity (e.g., there may be an areal density of $5 \times 10^9$ asperities per $cm^2$). A large portion of the asperities may have an average height greater than their base width (e.g., a base width of about 450 Angstroms and a height of about 750 Angstroms). The asperities are believed to be capable of producing high local fields at relatively low average field strength, thus reducing the inter-electrode field strength necessary for transport or tunneling of electrons from the electrode having the asperities to the adjacent electrode under the influence of an appropriate electric field therebetween. Without limiting the invention to any particular theoretical explanation, it is theorized that these high local fields are sufficient to inject electrons into relatively thick oxides (for tunneling purposes) while on the average a relatively low voltage is applied across the oxide. However, the electron transport enhancement provided by the asperities 34 is not bidirectional. When a smooth electrode surface lacking such asperities is oppositely biased with respect to another electrode, having asperities, electrons are not injected into the thick oxide at the relatively low voltages which would produce electron transfer from a surface possessing asperities under otherwise identical conditions.

Accordingly, it will be appreciated that the programming electrode 101 and its associated asperities 34 form a diode-like structure with the adjacent smooth undersurface of the floating gate 102. This structure will transport electrons from the programming electrode 101 through the separating approximately 1000 Angstrom thick oxide 112 when the floating gate is positively biased with respect to the programming electrode 101 at a voltage difference of less than 40 volts. However, when the programming electrode 101 is positively biased with respect to the floating gate 102 at an identical voltage difference of less than about 30 volts, electrons are not transported from the floating gate to the program electrode. Asperities 34 provide the same diode-like characteristic between the floating gate and the word select/erase electrode 103, with the enhanced transport occurring from the floating gate 102 to the word select/erase electrode 103 when the erase electrode is positively biased with respect to the floating gate 102. The bias electrode 26, formed in substrate 11, is capacitively coupled through oxide 112 to all three layers of polysilicons 20, 22 and 24 in various ratios depending on layer overlap. Since there are no asperities present on bias electrode 26, the capacitor formed between bias electrode 26 and all layers of polysilicon can sustain high voltages applied bidirectionally without tunnel current flow. This property of a substrate electrode may be useful for biasing the memory devices, especially when high voltages are present. Suitable asperities 34 for producing the above described diode-like characteristics can be produced over a range of conditions and a range of sizes, and are not limited to the particular example stated above.

A third polysilicon layer 24 is deposited (after etching and oxidation of the second floating gate layer) over the floating gate 102 and processed to form a word select/erase electrode 103, which in conjunction with the asperities on the top surface of the floating gate 102 and the biasing obtained from bias electrode 104 forms the means 50 for removing electrons from the floating gate, as previously indicated.

The fourth electrode, bias electrode 104, is diffused or implanted in the substrate 11. Although FIG. 1 illustrates the bias electrode 104 as positioned under portions of all three layers of polysilicon, it need only be under the floating gate 102. Bias electrode 104 acts to appropriately bias the floating gate 102 during the write erase, and read operations. A high doping level should be obtained in this substrate electrode 104 to ensure high conductivity. Also as seen in FIG. 1, bias electrode 104 is common with the source lines 18 of MOS sense transistor 108, such that, in the preferred embodiment, the source lines 18 provide the biasing voltage for electrode 104. Note that drain 16 is also useable for this purpose.

The overlapping region between the floating gate 102 and the programming gate 101 is the area in which electrons tunnel through the separating oxide 112 from the programming gate to the floating gate. By appropriately biasing the floating gate 102 to a positive polarity with respect to the programming electrode 101, electrons will tunnel from the programming electrode 101 to the floating gate 102. The electron charge is injected from the asperities 34 at the surface of the programming electrode by enhanced tunneling into the separating oxide 112. This charge travels to and is collected by the floating gate 102 under the influence of the positive bias. After the biasing voltage is removed from the floating gate 102, the tunneled electrons are confined on the floating gate, since they do not have the energy to surmount the energy barrier of the isolating oxide 112. The electrons may be retained substantially indefinitely on the floating gate unless removed, and provide a negative electric charge to the floating gate which is sufficient to turn off the floating gate MOS sense transistor 108.

Electrons may be removed from the floating gate by means of the word select/erase electrode 103. Erase electrode 103 is separated by a silicon dioxide dielectric layer 114 from, and positioned to overlap a portion of the surface of the floating gate 102 that includes asperities 34. By appropriately biasing the erase gate electrode 103 at a sufficiently high positive potential with respect to the floating gate, electrons may be caused to tunnel from the asperities on the upper surface of the floating gate to the erase electrode. In this manner the floating gate 102 may be provided with a relatively positive charge, which is sufficiently positive to turn on the n-channel MOS transistor 108.

In the illustrated embodiment, oxides 112, 114 are approximately 1000 Angstroms thick in the region where electron tunneling occurs, and are thus easily manufacturable in a reliable and reproducible manner. In this connection, while a 1000 Angstrom silicon dioxide dielectric thickness is used in the illustrated embodiment as an optimum thickness, the optimum thickness may decrease as manufacturing techniques are improved.

As indicated, means are provided for sensing the potential of the floating gate 102, and in this connection, as shown in FIGS. 1, 2 and 3, a portion 106 of the floating gate 102, in a channel 110, forms the gate electrode of an MOS sense transistor 108 comprising source and drain regions 120, 122 as shown in FIG. 3. These regions 120, 122 are respectively parts of the common source line 18 and drain line 16, and are of N+ conductivity type. As seen in FIG. 3, these regions 120, 122 are separated by intermediate portions 80, 82 of the p-type substrate 11. Zones 82 are modulated by the voltage of the word select/erase gate 103 and zone 80 is modulated by the voltage of region 106 of the floating gate 102. The conductivity of the region between the source and drain is thus modulated by the word select/erase gate 103 and the series gate portion 106 of the floating gate. In the illustrated embodiment 10, the regions 82 form enhancement transistors which require the bias gate 103 to be adequately positively biased relative to the substrate in regions 82 in order to allow conduction of current from source to drain when the floating gate is also on. The regions 82 may also be fabricated as depletion devices (which are normally on), such that the floating gate electrode portion 106 would directly modulate the source to drain current of the sense transistor 108, although the enhancement mode is conventionally used when the cells are in an array.

In operation of the device 10, the floating gate 102 is either charged with an excess number of electrons, which causes its voltage to be low (negative) and thereby functions to turn off the remotely located sense transistor 108, or the floating gate is charged relatively positive by a removal of electrons which causes its voltage to be high, thereby turning on the sense transistor 108. The on or off nature of the sense transistor 108 forms the basis for detecting the memory state of the floating gate 102 of the device 10. This memory state of the floating gate 102 may be altered by introducing (or "programming") electrons into the gate, and by removing (or "erasing") electrons from the gate.

The four-layer cell electrode structure of the illustrated embodiment 10 provides a fast, low power, rapidly alterable and long-term data retaining memory cell which is easy to manufacture, dense (therefore, relatively low cost) and has favorable resistance to so-called disturb limitations. Because of the relatively low average field required for tunneling (e.g., 2.5 to $4.0 \times 10^6$ volt/cm), reasonably thick oxides (1000 Angstroms) may be used between polysilicon layers. These features strongly favor standard manufacturing techniques and reasonable circuit design techniques. Because the electron source and sink structures for charging and discharging the floating gate 102 are fabricated from polysilicon layers dielectrically removed from the substrate 11, all of the "action" takes place above the substrate in the electrode structure formed from the three polysilicon layers 20, 22 and 24.

Figure 4:
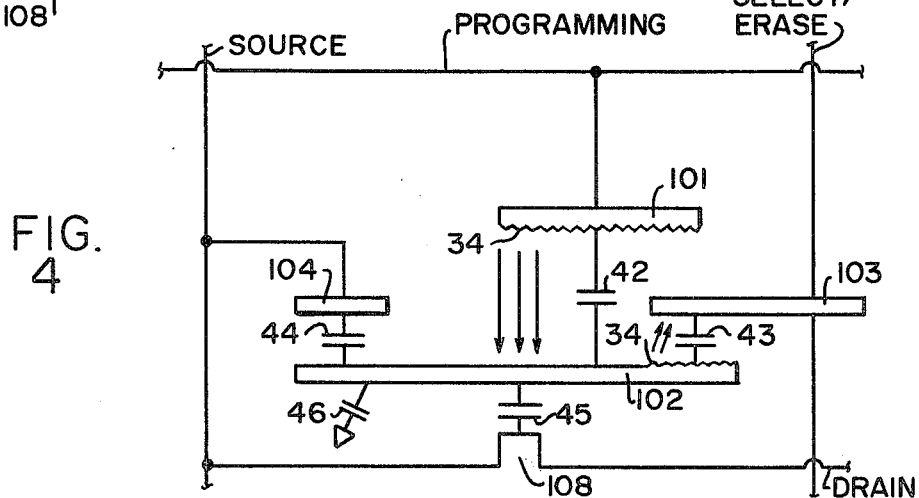
FIG. 4 is a schematic representation of the nonvolatile electrically-alterable floating gate cell of FIG. 1.

Turning now to FIG. 4, the operation of the device 10 will now be further described with respect to the circuit schematic of the cell 10 as shown therein. The programming electrode 101 forms a capacitor 42 having a capacitance $C_p$ with the adjacent surface of the floating gate 102 and provides charge (electrons) to the floating gate when a sufficient voltage is developed across the capacitor 42. When the floating gate is charged negative, the field effect transistor 108 is "off". The floating gate 102 also forms a capacitor 43 having a capacitance $C_w$ with the word select/erase electrode 103. When the floating gate 102 is charged positive as when electrons are tunneled from the floating gate 102 through erasing capacitor 43 the field effect transistor 108 is "on". The erase electrode 103 provides a charge sink for charge removal from the floating gate 102 when the voltage across capacitor 43 is large enough to tunnel electrons from the floating gate 102. The introduction of electrons onto the floating gate 102 is referred to as "programming" and the removal of electrons from the floating gate is referred to as "erasing".

The bias electrode 104 which is formed in the substrate, and comprises layer 26, forms a relatively large capacitor 44, having a capacitance $C_s$, with the floating gate. During programming the electrical potential of the bias electrode is made "high" ($\simeq 26$ volts), preferably by raising the voltage on the source line 18. During erasing, the potential of the bias electrode 104 is made "low" (0 volts).

The floating gate 102 also forms a gate capacitor 45 to the FET channel of sensing transistor 108. A field capacitor 46 is also formed in several locations under the field oxide. These latter capacitances having a combined capacitance $C_c$ degrade the programming, and should be minimized.

The capacitance $C_s$ of bias capacitor 44 should best be several times larger than any of the other individual capacitors illustrated in FIG. 4. The capacitance $C_s$ of capacitor 44 couples potential to the floating gate 102 for programming and erasing.

To make the cell 10 functional and to optimize its performance and layout, suitable capacitance relationships should be maintained to ensure that strong enough fields occur in capacitors 42, 43, 44 and 45 for programming, reading and erasing of the floating gate. For example, the table below lists a summary of typical conditions which may be utilized in the operation of the illustrated cell 10. These conditions illustrate cell operation, but are not intended to limit the more general description of operation.

A programming ratio can be defined as:

$$\text{PROGRAMMING RATIO} = \frac{C_s + C_w + C_c}{C_p} \simeq 2 \text{ to } 4$$

and an erase ratio defined as:

$$\text{ERASE RATIO} = \frac{C_s + C_p + C_c}{C_w} \simeq 2 \text{ to } 4$$

Useful devices are obtained if these ratio's are approximately met in the particular configuration of an array described hereinbelow.

TABLE I

| Mode | Bias Electrode (substrate) | Program Electrode | Word Select/Erase Electrode | Source Line | Drain Line |
|---|---|---|---|---|---|
| Program | 26 | 0 | 36 | 26 | 26 |
| Erase | 0 | 0 | 36 | 0 | 0 |
| Read | 0 | 0 | 5 | 0 | 3–5 |

Although the voltages given in Table I are preferred, when the cell is in an array, these electrode voltages of the illustrated embodiment must also be manipulated to prevent disturbing the data in adjacent cells. This aspect is described further in reference to Table II herein.

Figure 5:
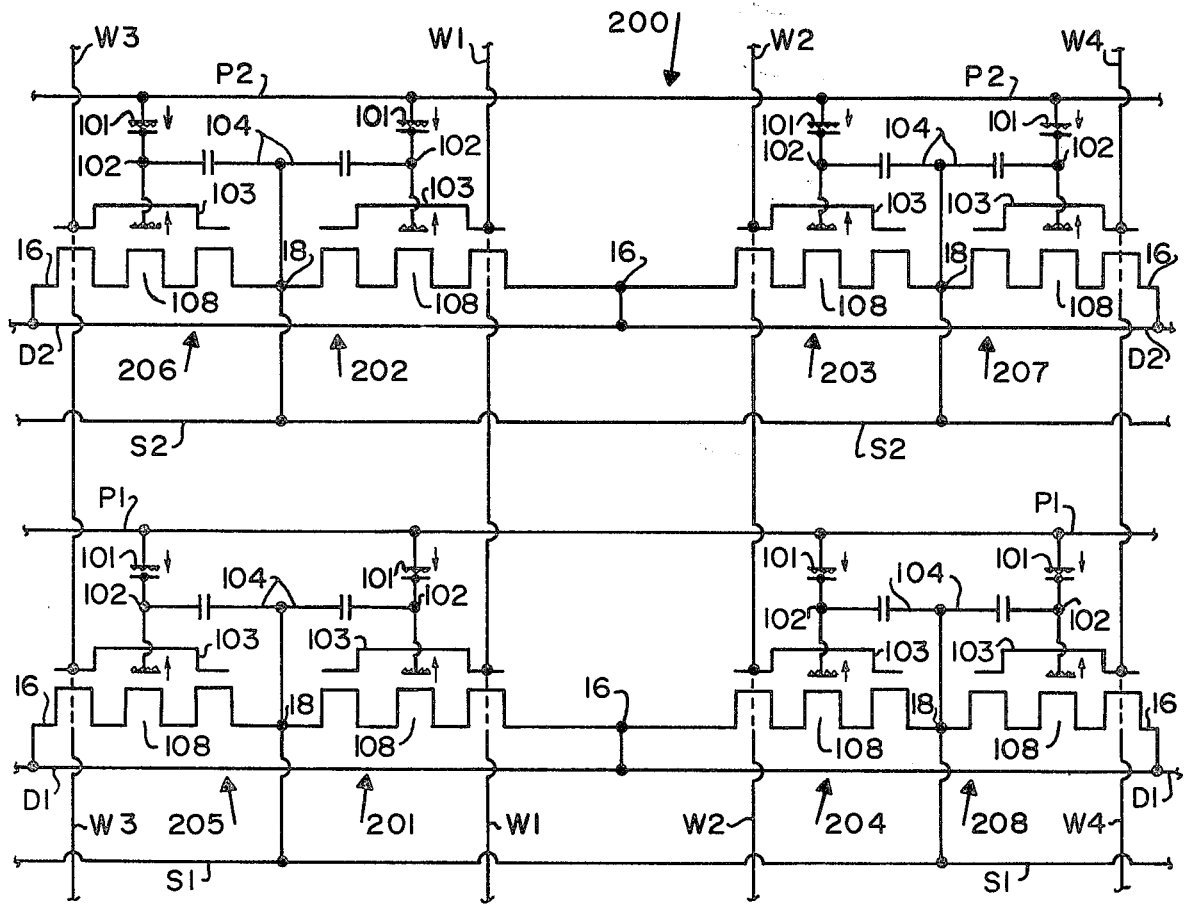
FIG. 5 illustrates a symbolic circuit schematic of the cells of FIG. 1, and further illustrates a plurality of the devices of the present invention in a memory array.

An important feature of the compact cell 10 is that it can be operated in a dense array of compact cells. FIG. 1 illustrates two cells sharing a common sense transistor drain contact, which may form a repeating unit in a large, integrated circuit array of memory cells. The unit cell dimensions of the illustrated cell pair 10, 12 of FIG. 1 are about 20 microns (Y direction) and 30 microns (X direction) for 4 micron design rules. In such an array, if a single cell is written, erased or read, then these operations should not disturb or modify the data in adjacent cells. In connection with discussion of such operation in a cell array, a symbolic representation of individual memory single cells is depicted in FIG. 5. Each of these cells is equivalent to the cell 10 shown in FIGS. 1, 2 and 3. The polysilicon word select/erase electrode 103 may continue from cell to cell across the array, for cell selection purposes, and accordingly will be referred to as a word select gate in the following description so as to make clear its function in the array. In FIG. 5, an array of cells each substantially the same as device 10 is schematically shown interconnected in a useful memory array which may be expanded in both the X and Y directions to form a very large memory device 200. Cell packing density is increased in this preferred array organization, as seen, since the source and drain lines can be shared over mirror imaged cells. In the illustration of the array, the cell 201 and its surrounding neighbors, 202 and 204, and a diagonally adjacent cell 203 are shown. Cells 205, 206, 207 and 208 are connected in a mirror image position with respect to respective cells 201 to 204. Cell 201 can be written, erased and read in the array without distrubing the immediately and diagonally adjacent cells 202, 203 and 204 or its mirror image cell 205.

Typical operational voltages impressed on the array of FIG. 5 for each of the elements of the array, to perform the various described memory functions, may be as follows:

TABLE II

| | ARRAY OPERATION ||||||||||||||||
| | Cell 201 |||| Cell 202 |||| Cell 203 |||| Cell 204 ||||
| | P1 | S1 | W1 | D1 | P2 | S2 | W1 | D2 | P2 | S2 | W2 | D2 | P1 | S1 | W2 | D1 |
| FUNCTION | | | | | | | | | | | | | | | | |
| Program Cell 201 | 0 | 26 | 36 | 26 | 26 | 26 | 36 | 26 | 26 | 26 | 0 | 26 | 0 | 26 | 0 | 26 |
| Erase Cell 201 | 0 | 0 | 36 | 0 | 26 | 26 | 36 | 26 | 26 | 26 | 0 | 26 | 0 | 0 | 0 | 0 |
| Read Cell 201 | 0 | 0 | 5 | 5 | 0 | 0 | 5 | 0 | 0 | 0 | 0 | 0 | 0 | 0 | 0 | 5 |

In the table, it is useful to elaborate on a few conditions. While programming or writing cell 201 the word select/erase gate line W1 is provided with a voltage pulse of plus 36 volts. Source line S1 is 26 volts to additionally bias the bias electrode 104 which thereby biases the floating gate positive through capacitor $C_s$ to promote electron flow to the floating gate of 201 from program line P1. The word select/erase line is biased +36 volts to further pull up the floating gate. Otherwise the capacitor $C_w$ would act as a load to prevent the floating gate from rising to a sufficient level to enable programming to occur. Since S1 is 26 volts, drain line D1 must be 26 volts to stop any current flow through regions 82, 80, 82 which would otherwise be difficult to maintain and would cause unwanted power consumption. To avoid programming in cell 204, where W2 and P1 are 0 volts and S1 is +26 volts, the capacitive ratio between $C_w$, $C_p$ and $C_s$ is selected such that the floating gate potential is not so large that it causes tunneling of electrons from P1 to the floating gate. In order not to program adjacent cell 202, the program line P2 is simultaneously maintained at approximately +26 volts to prevent electrons from entering the floating gate of the unselected cell 202. Source line S2 is +26 volts, so that D2 must also be +26 volts for the same reason as mentioned above for biasing D1 high when S1 is high. The line P2 is chosen to be +26 volts for convenience, and could be another voltage determined to optimize cell operation. With program line P2 also coupling +26 volts to cell 203, one might believe electrons would flow from the floating gate on cell 203 to the program select line P2. However, this will not happen because of the diode-like characteristic of the floating gate charging and discharging structure created by the asperities 34, as described above, which tend to conduct in a preferred singular direction opposite to the condition presented in this disturb example. Therefore, the memory charge content of cell 203 is not disturbed. "Disturbance" is defined here to mean an inadvertent altering of memory charge content of a non-addressed cell by reading, inadvertently programming or erasing that cell's floating gate. The exact ratio of capacitance is used to optimize cell performance consistent with no disturb conditions in the array.

Similarly, cell 201 may be erased without disturb problems in adjacent cells 202, 203, or 204. In this case the word select/erase gate W1 is at +36 volts and all other electrodes except P2, S2 and D2 are at 0 volts.

Line P2 is biased at +26 volts to prevent disturbing cell 202 by keeping the potential between P2 and W1 small such that not tunneling occurs. In cell 203, since P2 is high (approximately +26 volts) and S2 is high (approximately +26 volts) then the floating gate is biased negative to P2. However, the diode action of the asperities will prevent electrons from leaving the floating gate to P2. At the same time, the ratio of capacitance is chosen to assure that no electrons flow into the floating gate from the word select line W2. This is done by controlling the voltage on the floating gate using the capacitive ratio's. Disturbance problems do not exist in cell 204.

Therefore, it has been shown that by controlling the absolute voltage of the floating gate through the capacitive ratios in the cell, and by using the diode properties of the asperities and the bias control of the bias electrode, it is possible to produce a dense array of cells which will operate without disturb.

In the read operation, only potentials of plus 5 volts and 0 volts are present. Therefore, no significant disturb problems can occur because the electrical fields developed are too low. It will be appreciated that by simple symmetry relationship conditions, a large array of memory cells may be constructed with no disturb problems, and that the device of the invention is suitable for incorporation in a large array.

While the present invention has been particularly described with respect to the illustrated embodiment, it will be appreciated that various alterations, modifications and adaptations may be made based on the present disclosure, and are intended to be within the spirit and scope of the present invention.

In this connection, it will be appreciated that devices, and arrays of such devices, are compatible with various integrated circuit technologies such as CMOS (including CMOS/SOS) and bipolar integrated circuit design, and may be used in integrated circuits incorporating CMOS and bipolar integrated circuit elements. It will be further appreciated that while the illustrated embodiment covers a particular overlapping arrangement of the tunneling regions of the devices, narrow gap devices in which the tunnel regions are not overlapped, but have asperities laterally adjacent surfaces of the electrode and floating gate and are of sufficient lateral proximity to provide for tunnel current, may be provided. Further, the nonvolatile electrically programmable devices may be used in electrical connection in integrated circuit arrays with volatile memory elements such as RAM cells to provide nonvolatile memory devices such as nonvolatile RAM devices.

The device may be used as means for disconnecting or connecting defective or redundant memory elements in a large integrated circuit memory array to provide fault tolerance to the memory array. Defective memory elements or memory loops in an integrated circuit having memory devices or loops suitably connectable or disconnectable by means of floating gates of such devices may be readily disconnected during testing following manufacture to increase the manufacturing yield. Disconnection of failed memory elements or loops, and/or addition of redundant or spare memory elements or loops may be subsequently carried out under control of the devices to prolong or repair the operation of the memory device. Similarly, devices in accordance with the present invention may be used in an integrated circuit microcomputer chip to reconfigure the logical elements (including register, memory, etc.) and busses of the microcomputer to provide a dynamically reconfigurable microcomputer device.

In the provision of such fault tolerant and dynamically reconfigurable systems, it will be appreciated that the floating gate of the nonvolatile devices may form the gate of a MOS switch transistor, the conducting or nonconducting of which may be utilized to connect or disconnect the desired elements of the integrated circuit.

Various features of the invention are set forth in the following claims.

What is claimed is:

1. A nonvolatile, electrically-alterable floating gate memory device comprising:
    a semiconductor substrate;
    a floating gate conductor;
    means for dielectrically insulating said floating gate conductor;
    means for detecting the electrical charge on said floating gate conductor;
    first electrode means intermediate said substrate and said floating gate conductor for introducing electrons onto said floating gate conductor, and including means for enhancing tunneling of charge across said insulating means from said first electrode means to said floating gate conductor;
    second electrode means overlying said floating gate conductor such that said floating gate conductor is intermediate said substrate and said second electrode means for removing electrons from said floating gate conductor, and including means for enhancing tunneling of charge across said insulating means from said floating gate conductor to said second electrode means;
    means for capacitively biasing said floating gate conductor comprising a bias electrode formed in said substrate and underlying at least a part of said floating gate conductor;
    means for dielectrically insulating said first electrode means and said second electrode means from said substrate and from each other; and
    a sense transistor having a source, a drain and a channel intermediate said source and said drain formed in said substrate, said channel including a first region whose conductivity is modulated by the electrical charge of said floating gate conductor, and at least one additional region positioned in a series relationship with said first region and said source and drain, whose conductivity is modulated by the present potential of said second electrode means.

2. A device in accordance with claim 1 wherein said floating gate conductor and said second electrode are positioned closer to said substrate at a point in said substrate wherein said regions are formed than at other points with respect to said substrate.

3. A nonvolatile, electrically-alterable floating gate memory device comprising:
    a semiconductor substrate;
    a floating gate conductor;
    means for dielectrically insulating said floating gate conductor;
    means for detecting the electrical charge on said floating gate conductor;
    first electrode means intermediate said substrate and said floating gate conductor for introducing electrons onto said floating gate conductor, and including means for enhancing tunneling of charge across said insulating means from said first electrode means to said floating gate conductor;

second electrode means overlying said floating gate conductor such that said floating gate conductor is intermediate said substrate and said second electrode means for removing electrons from said floating gate conductor, and including means for enhancing tunneling of charge across said dielectric insulation from said floating gate conductor to said second electrode means;

means for capacitively biasing said floating gate conductor comprising a bias electrode formed in said substrate and underlying at least a part of said floating gate conductor, and further underlying at least a portion of said first and second electrode means; and means for dielectrically insulating said first electrode means and said second electrode means from said substrate and from each other.

4. An integrated circuit memory array formed on a semiconductor substrate with a plurality of substantially like devices forming an integrated circuit memory component, each of said devices comprising:

a floating gate conductor;

means for dielectrically insulating said floating gate conductor;

first electrode means intermediate said substrate and said floating gate conductor for introducing electrons onto said floating gate conductor and including means for enhancing tunnelling of charge across said dielectric insulation from said first electrode means to said floating gate conductor;

second electrode means overlying said floating gate conductor such that said floating gate conductor is intermediate said substrate and said second electrode means for removing electrons from said floating gate conductor, and including means for enhancing tunnelling of charge across said insulating means from said floating gate conductor to said second electrode means;

means for capacitively biasing said floating gate conductor comprising a bias electrode formed in said substrate and underlying at least a part of said floating gate conductor; and means for dielectrically insulating said first electrode means and said second electrode means from said substrate and from each other;

said second electrode means extending to contiguous memory devices in a given X axis row in said array to form X axis word select/erase lines in said array; contiguous detecting means in said array being connected by a metal conductor to form Y axis sensing lines for sensing of the present state of said floating gate conductor in a selected memory device; said first electrode means extending to contiguous memory devices in said array to form Y axis program bit lines in said array; and said bias electrode including conductor means for biasing, in common, contiguous memory devices in a given Y axis column of said array.

5. An integrated circuit memory array formed on a semiconductor substrate comprising:

a plurality of substantially like integrated circuit memory devices, each of said devices including:

a floating gate conductor;

means for detecting the electrical charge on said floating gate conductor;

a first electrode intermediate said substrate and said floating gate conductor, said first electrode being in a capacitive relationship with said floating gate conductor and dielectrically insulated from said substrate;

a second electrode overlying said floating gate conductor such that said floating gate conductor is intermediate said substrate and said second electrode, said second electrode being in a capacitive relationship with said floating gate conductor and dielectrically insulated from each of said first electrode and said substrate; and a bias electrode disposed in said substrate and being in a capacitive relationship with said floating gate conductor;

each said capacitive relationship selected so that said bias electrode operates to capacitively couple of a first and a second potential to said floating gate conductor whereby electrons tunnel from said first electrode to said floating gate conductor when said first potential is applied to said bias electrode and electrons tunnel from said floating gate conductor to said second electrode when said second potential is applied to said bias electrode;

said second electrode extending to contiguous memory devices in a given X axis row in said array to form X axis work select/erase lines in said array; contiguous detecting means in said array being connected by a metal conductor to form Y axis sensing lines for sensing the present state of said floating gate conductor in a selected memory device; said first electrode extending to contiguous memory devices in said array to form Y axis program bit lines in said array; and said bias electrode including conductor means for biasing, in common, contiguous memory devices in a given Y axis column of said array.

6. An array in accordance with claim 5, wherein said detecting means includes a sense transistor having a source, a drain and a channel intermediate said source and said drain formed in said substrate, and further has a gate formed from a portion of said floating gate conductor, said metal conductor connecting each said source of said sence transistors in a given Y axis column.

7. An array in accordance with claim 6 wherein each said source in a given Y axis column and the associated bias electrode in each said device are electrically formed from a continuous diffused region in said substrate.

* * * * *